United States Patent [19]

Andreev et al.

[11] 4,436,830
[45] Mar. 13, 1984

[54] COATING FOR METAL-CUTTING TOOLS

[76] Inventors: Anatoly A. Andreev, Danilevskogo, ulitsa 31, kv. 47; Igor V. Gavrilko, Traktorostroitelei, ulitsa 65, kv. 71, both of Kharkov; Alexei G. Gavrilov, Vostochnaya, ulitsa 11, kv. 6, Domodedovo Moskovskaya oblast; Anatoly S. Vereschaka, Kastanaevskaya, ulitsa 42, korpus 1, kv. 57; Viktor P. Zhed, Uchebny pereulok, 2, kv. 57, both of Moscow; Valentin G. Padalka, Danilevskogo, ulitsa 10, kv. 122, Kharkov; Andrei K. Sinelschikov, Pervomaiskaya, ulitsa 20, kv. 32, Moscow, all of U.S.S.R.

[21] Appl. No.: 438,961

[22] PCT Filed: Mar. 2, 1981

[86] PCT No.: PCT/SU81/00025

§ 371 Date: Oct. 28, 1982

§ 102(e) Date: Oct. 28, 1982

[87] PCT Pub. No.: WO82/03036

PCT Pub. Date: Sep. 16, 1982

[51] Int. Cl.³ .............................................. C04B 35/58
[52] U.S. Cl. ........................................ 501/96; 501/97
[58] Field of Search .................................... 501/96, 97

[56] References Cited

U.S. PATENT DOCUMENTS

| | | | |
|---|---|---|---|
| 3,108,887 | 10/1963 | Lenie et al. | 501/97 |
| 3,251,698 | 5/1966 | Colton | 501/96 |
| 3,544,486 | 12/1970 | Passmore | 501/96 |
| 3,649,314 | 3/1972 | James | 501/96 |
| 3,679,442 | 7/1972 | Bergna | 501/96 |

*Primary Examiner*—James Poer
*Attorney, Agent, or Firm*—Lilling & Greenspan

[57] ABSTRACT

A coating for a metal-cutting tool consisting of 90 to 70 wt. % of titanium nitride and 10 to 30 wt. % of chromium nitride or 3 to 18 wt. % of aluminium nitride, 2 to 8 wt. % of molybdenum nitride, 2 to 10 wt. % of chromium nitride, 0.5 to 10 wt. % of silicon nitride, taken in combination and uniformly distributed within the volume of the coating, titanium nitride being the balance.

The coating is intended predominantly for application to metal-cutting tools when working stainless steels and refractory alloys.

1 Claim, No Drawings

COATING FOR METAL-CUTTING TOOLS

FIELD OF THE INVENTION

The present invention relates to the metal working and, more specifically, to a coating for metal-cutting tools.

BACKGROUND OF THE INVENTION

Known in the art is a titanium nitride-based coating for a metal-cutting tool (cf. e.g., H. F. Bunshan et al. Thin solid films, 1977, 45, No. 3, pp.453–462).

Tools with coating of titanium nitride show a high abrasion-resistance in machining of workpieces of structural steels which exceeds by 5–7 times that of tools without coating.

However, in machining, by means of a tool with coating of titanium nitride, parts made of stainless steels and refractory alloys wear-resistance of such tools is but insufficient. The reason therefor resides in a high degree of an adhesion interaction of the coating with the machined workpiece which occurs at the contact surfaces of the tool during cutting. As a result, temperature in the cutting zone is increased and mechanical strength of the coating is substantially reduced at the account of the effect produced by water vapours and oxygen.

SUMMARY OF THE INVENTION

The present invention is directed to the provision of a coating for metal-cutting tools having such a composition which would ensure a high wear-resistance of the tool provided with such coating in machining of workpiece made of stainless steels and refractory alloys.

Said object is accomplished by that the coating for metal-cutting tools consisting of titanium nitride, according to the present invention, additionally contains either chromium nitride in an amount of from 10 to 30% or taken in combination and uniformly distributed over the coating volume aluminium nitride in an amount of from 3 to 18% by weight, molybdenum nitride in an amount of from 2 to 8% by weight, chromium nitride in an amount of 2 to 10% by weight and silicon nitride in an amount of from 0.5 to 10% by weight.

The bicomponent coating consisting of nitrides of chromium and titanium is somewhat less expensive in manufacture, whereas the multi-component coating ensures a high wear-resistance for a wider range of machinable materials.

Both embodiments of the coating according to the present invention, while being applied onto the metal-cutting tool, improve its wear-resistance in machining of stainless steels and refractory alloys by 4–6 times as compared to a known coating based on titanium nitride.

In machining of stainless steels and refractory alloys chromium nitride in the coating consisting of titanium nitride and chromium nitride acts as a barrier hindering active adhesion processes on contact areas of the tool thus increasing its wear-resistance. Furthermore, partial oxidation of boron nitride occurring at high temperature developing during the cutting process results in the formation of thermodynamically stable chromium oxides which still more reduce the adhesion-fatigue wear of the tool.

In the use of a coating consisting of nitrides of titanium, aluminium, molybdenum, chromium and silicon in the above-mentioned ratio, said nitrides ensure a high microhardness of the coating and, owing to their uniform distribution within the volume, all enter into operation simultaneously. As the temperature in the cutting zone is increased, the resulting abrasion products and the superficial layer of the coating containing nitrides of aluminium, molybdenum are subjected to oxidation with air oxygen and water vapours to oxides. The resulting aluminium oxide lowers the adhesive interaction of the tool with the machined material and decreases the chemical activity of the coating. The molybdenum oxide formed in the course of cutting possesses lubricating properties and contributes to a redeced friction coefficient and, consequently, lowered temperature in the cutting zone. As the temperature is increased, chromium nitride starts to decompose with the formation of a stable oxide creating an electrical barrier hindering the redistribution of the current carriers. The converted nitrides protect titanium and silicon nitrides from losing their mechanical strength which nitrides are responsible for a high hardness within the entire volume of the coating.

The quantitative proportions of the above-specified nitrides has been selected so as to ensure thermodynamical stability of the coating.

Taking into consideration the fact that all components in the coating are distributed uniformly in the above-mentioned proportions, they are permanently present at the contact face of the tool and diminish the effect of factors lowering the coating durability during machining of stainless steels and refractory alloys.

The coating according to the present invention can be applied onto the working surface of any metal-cutting tool following rather simple procedure, e.g. using one of the known methods specified hereinbelow:

(a) scattering of a mosaic cathode made of a set of plates (segments) of the above-mentioned materials in the atmosphere of nitrogen under a pressure of $(3-50) \times 10^{-3}$ mm Hg;

(b) cathodic atomization of a powder-like mixture consisting of the above-mentioned materials in the predetermined proportions in the atmosphere of nitrogen under pressure of $(3-5) \times 10^{-3}$ mm Hg;

(c) evaporation of a cathode consisting of titanium, alloyed with either chromium or aluminium, molybdenum, chromium and silicon in a vacuum chamber in the atmosphere of nitrogen (method of the matter condensation from plasma with ionic bombardment).

BEST EMBODIMENTS OF THE INVENTION

The present invention will now become more fully apparent from the following detailed description and illustrating examples.

EXAMPLE 1

Onto the working face of a metal-cutting tool (cutter) made of an alloy belonging to the group K (ISO Classification) a coating is applied by the method of condensation of substance from metal plasma with ionic bombardment.

This process is effected by way of a simultaneous evaporation of titanium and chromium and admission of nitrogen into a vacuum chamber to maintain its pressure at $(2-5) \times 10^{-3}$ mm Hg.

The proportions of titanium and chromium in the coating are adjusted by varying the discharge current values on each evaporator.

Testing were carried out with the cutters having the coating containing respectively 10, 20 and 30% of chromium nitride, titanium nitride being the balance.

The tests were carried out at a longitudinal cutting of a refractory alloy having the following composition, percent by weight: C—0.1-0.16; Si—below 0.6; Mn—below 0.6; Cr—10.5-12; Ni—15-1.8; W—1.6-2; Mo—0.35-0.5; V—0.18-0.3; Fe—the balance.

The cutting conditions were as follows: cutting speed V=37.3 m/min; feed S=0.15 mm/rev.; cutting t=0.3-0.5 mm.

For obtaining comparative results, tests of a cutting tool with the known coating of titanium nitride were carried out under the same conditions.

The test results are summarized in Table 1 given hereinbelow.

TABLE 1

| Coating components | Content, % | Resistance, min. |
| --- | --- | --- |
| TiN—CrN | 10 | 21.5 |
|  | 20 | 25.5 |
|  | 30 | 28.0 |
| TiN | — | 4.9 |

It follows from the above Table 1 that in machining of the refractory alloy the resistance of the tool with the coating according to the present invention is by 2-5 times higher than that of the tool with the known coating.

EXAMPLE 2

Onto a cutter with three-facet non-resharpened plate of an alloy of the group M or K (according to ISO) a coating is applied by the method of condensation of substance from metal plasma following the procedure of Example 1; the coating has the following composition: AlN—5.5%, $Mo_2N$—2.0%, CrN—2%, SiN—0.5%, TiN—the balance. The cutter testing was effected upon cutting of chrome-nockel steel containing, percent by weight: C—below 0.12, Si—below 0.8, Mn—1-1.2, Cr—17-19, Ni—9-1, Ti—about 0.8, Fe—the balance.

Cutting conditions were as follows: t=3 mm, S=0.3 mm/rev., V=122 m/min.

The tests revealed the cutter resistance of 30 min. for 3 facets.

For the purpose of comparison, a similar cutter was tested which had a coating of titanium nitride. Under the same conditions its resistance was 5.4 min. for 3 facets, or by 5.5 times lower than that of the cutter with the coating according to the present invention.

EXAMPLE 3

Onto a cutter with three-facet non-resharpened tip of an alloy of the group K (according to ISO) a coating is applied by the method of condensation of a substance from metal plasma; the coating contains: AlN—18%, $Mo_2N$—4%, CrN—5%, SiN—5%, TiN—68%. The testing of the cutter is carried out at longitudinal cutting of steel containing, percent by weight: C—0.11-0.17, Si—below 0.8, Cr—16-18, Ni—1.5-2.5, Fe—the balance. The cutting conditions were the same as in Example 2 hereinabove. The tests revealed that the cutter resistance was 25 minutes for 3 facets.

EXAMPLE 4

The experiment is effected in a manner similar to that described in the foregoing Example 3, except that the coating is applied consisting of: AlN—5.5%, $Mo_2N$—4%, CrN—5%, SiN—10%, TiN—the balance. The cutter resistance as shown by the tests was 22 minutes for 3 facets.

The coatings described in Examples 3 and 4 ensured increased resistance of the cutting tools upon machining of stainless steel by about 4.5 times as compared to the cutting tool with the coating of titanium nitride (described in Example 2 hereinbefore).

EXAMPLE 5

Different coatings are applied onto the working face of three similar gear shapers of high-speed steel by the method of condensation of a substance from metal plasma; the steel containing: 6% W, 5% of Mo, Fe—the balance. Onto one gear shaper a coating is applied consisting of 20% of CrN, 80% of TiN; onto the second—a coating consisting of 5% AlN, 6% of $Mo_2N$, 4% of CrN, 5% of SiN and TiN—the balance; onto the third—for comparison—a known coating based on TiN.

The testing of the gear shapers is effected on a gear-shaping tool upon machining of a steel containing, percent by weight: C—1.6, Cr, Mn, Ti, N—each about 1, Fe—the balance.

Cutting conditions are as follows: number of double strokes of throttle per minute—125, circular feed—0.25 min/doubl.stroke.

As a result of the tests the resistance of the gear shaper with the coating of CrN-TiN was 1040 min; the resistance of the gear shaper with the multi-component coating was 1196 min; the resistance of the gear shaper with the coating of TiN was 273 min, i.e. it was considerably lower than that of the tools with the coating according to the present invention: by 3.8 and 4.4 times respectively.

EXAMPLE 6

The experiment is effected in a manner similar to that described in Example 3 hereinbefore. A multi-component coating is deposited consisting of: AlN—3%, $Mo_2N$—2%, CrN—2%, SiN—3%, TiN—the balance. As a result of tests, the cutter resistance was 18 minutes for 3 faces, i.e. by 2.4 times higher than the resistance of a similar cutter with the coating of titanium nitride.

EXAMPLE 7

The experiment is carried out following the procedure of Example 3 hereinbefore. A multi-component coating is applied which consists of: AlN—3%, $Mo_2N$—8%, CrN—2%, SiN—3%, TiN—the balance. As a result of tests the resistance of the cutter is 25 min for 3 faces which is 3.3 times higher than the resistance of a similar cutter with a coating of titanium nitride.

EXAMPLE 8

The experiment is conducted in a manner similar to that described in Example 3. A multi-component coating is deposited which has the following composition: AlN—3%, $Mo_2N$—8%, CrN—10%, SiN—3%, TiN—the balance.

The tests have shown that the resistance of the cutter is 22 min for 3 faces, i.e. by 2.9 times higher than that of a similar cutter with the known coating of titanium nitride.

INDUSTRIAL APPLICABILITY

The coating according to the present invention can be employed for any metal-cutting tool: drills, cutters, milling cutters, etc., especially for tools made of high-speed cutting steel and employed in machining of parts manufactured from stainless steels and refractory alloys.

We claim:

1. A coating for a metal-cutting tool consisting of titanium nitride, characterized in that it additionally contains either chromium nitride in an amount of from 10 to 30% by weight, or aluminium nitride in an amount of from 3 to 18% by weight, molybdenum nitride in an amount of from 2 to 8% by weight, chromium nitride in an amount of from 2 to 10% by weight and silicon nitride in an amount of from 0.5 to 10% by weight, all being taken in combination and uniformly distributed within the volume of the coating.

* * * * *